United States Patent [19]
Lin et al.

[11] Patent Number: 6,140,232
[45] Date of Patent: Oct. 31, 2000

[54] METHOD FOR REDUCING SILICIDE RESISTANCE

[75] Inventors: Yu-Tsai Lin, Kung-Kuan Hsiang; Kun-Lin Wu, Hsin-Chu, both of Taiwan

[73] Assignee: United Microelectronics Corp., Hsin-Chu, Taiwan

[21] Appl. No.: 09/386,673

[22] Filed: Aug. 31, 1999

[51] Int. Cl.⁷ .................................................. H01L 21/283
[52] U.S. Cl. ............................................. 438/664; 438/638
[58] Field of Search ...................................... 438/664, 638, 438/FOR 196

[56] References Cited

U.S. PATENT DOCUMENTS

| | | |
|---|---|---|
| 4,751,198 | 6/1988 | Anderson . |
| 5,451,545 | 9/1995 | Ramaswami et al. . |
| 5,573,980 | 11/1996 | Yoo . |
| 5,913,139 | 6/1999 | Hashimoto et al. . |
| 5,963,829 | 10/1999 | Matsubara . |

*Primary Examiner*—George Fourson
*Assistant Examiner*—Joannie A. Garcia
*Attorney, Agent, or Firm*—Harness, Dickey, Pierce, P.L.C.

[57] ABSTRACT

A method for forming narrow line width silicide having reduced sheet resistance is disclosed by the present invention. The method includes: firstly, providing a semiconductor substrate, whereon there formed at least a source/drain region and a gate region, as well as a spacer formed on a sidewall of the gate region; then, depositing a titanium metal layer overlying the semiconductor substrate and the resulting structure; next, carrying out rapid thermal processing and RCA cleaning to form a first titanium silicide layer; consequentially, forming a selective polysilicon layer over the first titanium silicide layer; and, depositing a second titanium metal layer over the selective polysilicon layer and overlying the exposed surface of spacer; finally, carrying out rapid thermal processing and RCA cleaning once again to form a second titanium silicide layer. The overall thickness of titanium silicide is depending on the requiring resistance of titanium silicide under a certain line width.

19 Claims, 4 Drawing Sheets

METHOD FOR REDUCING SILICIDE RESISTANCE

BACKGROUND OF THE INVENTION

1. Field of the Invention

The present invention generally relates to a method for fabricating titanium silicide of MOS devices, and more particularly, in accordance with the trend of narrow line width, the thickness of titanium silicide is increased effectively for reducing its sheet resistance.

2. Description of the Prior Art

In semiconductor fabrication of integrated circuits, suicides are normally used as the material for interconnection to overcome the inherent shortcomings of polysilicon. The major shortcoming of polysilicon is its minimum sheet resistance of about 10 ohms per square. Silicides are materials formed by the reaction of a refractory metal or a near-noble metal with silicon. Due to the characteristic of low sheet resistivity of silicides, it has become the practice to provide a silicide layer over polysilicon for improving the fabrication of large scale integration. Furthermore, silicides can also reduce the size of interconnection and the line width of gate electrodes, hence, achieving the requirement of very large scale integration.

An increment in device integrity makes the resistance of MOS device source/drain regions gradually climb up and almost equal to the resistance of MOS device channel. In order to reduce the sheet resistance of source/drain regions and to guarantee a complete shallow junction between metal and MOS devices, the application of a "Self Aligned Silicide" process is gradually steeping into the VLSI fabrication of 0.5 µm and below. This particular process is called Salicide for short.

Titanium is the most common used metallic material for the current salicide process (others include platinum, cobalt, etc.). Basically, titanium is a fine oxygen gettering material, where under an appropriate temperature titanium and silicon at MOS device source/drain and gate regions are easily mutually diffused to form a titanium silicide with very low resistance.

In fact, under the trend of developing highly integrated devices, the resistance of titanium silicide and the line width have an enormous relationship, in particular when the line width of MOS transistors is smaller than 0.3 µm. An even more obvious trend in the rising of sheet resistance exists. Therefore, a modification toward the existing fabrication is needed to overcome the problem of the increment in titanium silicide sheet resistance.

SUMMARY OF THE INVENTION

In accordance with the present invention, a method is provided for forming narrow line width silicide that substantially reduces the sheet resistance of silicides and overcomes the drawbacks of the conventional methods.

Another object of the present invention is aiming at the same line width, which increases the overall thickness of titanium silicide for obtaining a titanium silicide having a much lower sheet resistance.

In accordance with the above objects, a method for reducing the resistance of narrow line width titanium silicide is provided by the present invention, wherein the method comprises: providing a semiconductor substrate, whereon there formed at least a source/drain region and a gate region, as well as a spacer formed on a sidewall of the gate region; next, depositing a first metal layer overlying the substrate and the resulting structure; then, carrying out rapid thermal processing and wet chemical cleaning to form a first silicide layer; subsequently, selective forming a silicon layer over the first silicide layer only; depositing a second metal layer over the silicon layer and overlying the exposed surface of the spacer; and again carrying out rapid thermal processing and wet chemical cleaning to form a second silicide layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 1–8, the process flow of a preferred embodiment according to the present invention is depicted in cross-sectional sectional views. These drawings merely show several key steps in sequential processes.

Figure 1:
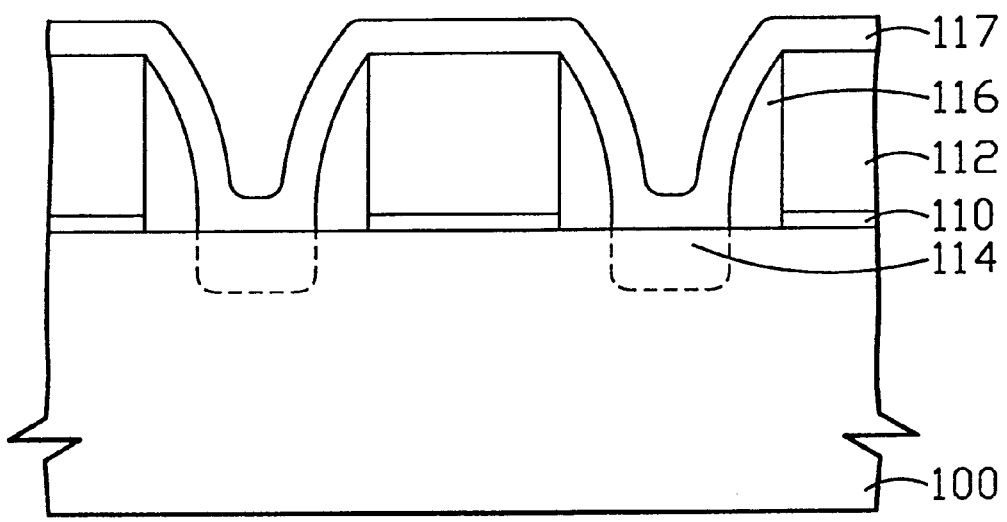
FIG. 1 to FIG. 8 depicts the process flow of a preferred embodiment according to the present invention in cross-sectional views.

First of all, starting from FIG. 1, a silicon substrate 100 is provided and a MOS device formed thereon. The MOS device comprises a source/drain region 114, a gate region, and as well as a spacer 116 formed on the sidewall of the gate region. This gate region is composed of a gate oxide layer 110 and a polysilicon layer 112. Next, a titanium metal layer 117 is deposited overlying the exposed surfaces of silicon substrate 100 and the MOS device by using the conventional plasma enhanced chemical vapor deposition (PECVD) method. The thickness of the titanium metal layer 117 is ranging from about 50 angstroms to about 350 angstroms.

Figure 2:
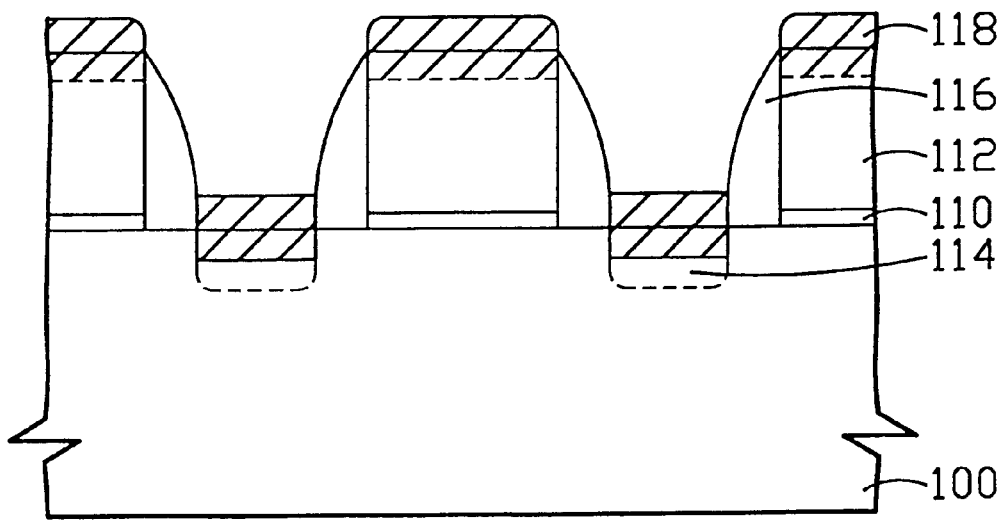

Now referring to FIG. 2, a rapid thermal processing is performed at a temperature in between 400° C. and 750° C. against the titanium metal layer, wherein part of the titanium metal layer will mutually diffuse with the silicon on the source/drain region and with the polysilicon of the gate region for forming a titanium silicide 118 with low resistivity. The titanium silicide 118 has a thickness of about 600 angstroms. Consequentially, the unreacted titanium metal, and titanium reaction product other than titanium silicide are removed by applying the RCA cleaning method. Hence, the titanium silicide layer 118 only resides on top of the gate region and the source/drain region. A rapid thermal processing is performed again at a higher temperature in between about 700° C. and about 850° C. The titanium silicide layer formed by a conventional salicide process has two basic structures, a metastable C-49 phase titanium silicide (C-49 TiSi$_x$) structure, and a thermodynamically more stable C-54 phase titanium silicide (C-54 TiSi$_2$) structure having a lower resistance. C-49 phase titanium silicide has a resistance of between 60 µΩ-cm to 90 µΩ-cm and a formation temperature of between about 400° C. to 750° C. C-54 phase titanium silicide has a lower resistance of between 14 µΩ-cm. to 16 µΩ-cm., but a rather high formation temperature of between 700° C. to 850° C. In the manufacturing process, generally the higher resistance C-49 phase titanium silicide will be transformed to a lower resistance C-54 phase titanium silicide through the application of a rapid thermal processing (RTP).

Figure 3:
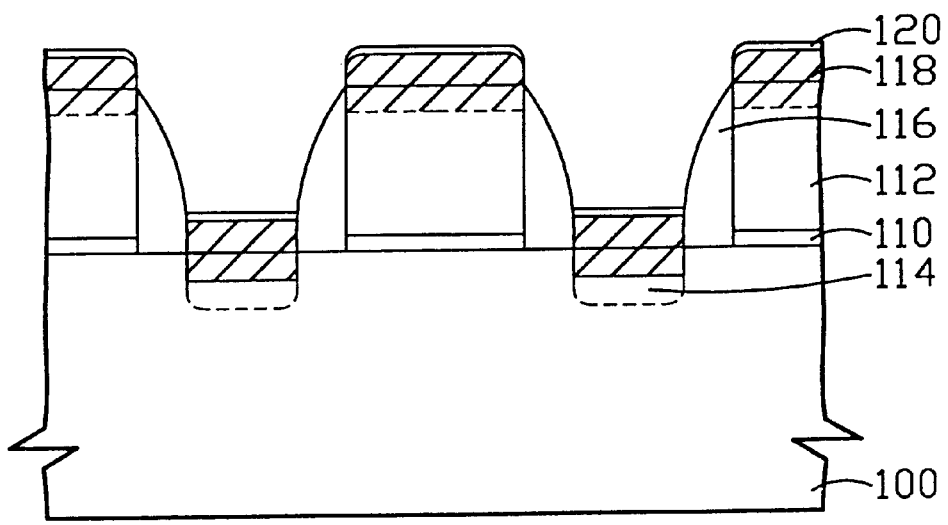

Next in FIG. 3, a specific ASM EPSILON 2500 (trademark for epitaxial deposition system; ASM International N.V.) machine with specially designated operating conditions, such as, operating temperature ranges from about 650° C. to about 850° C., pressure is controlled in between about 10 torr and 50 torr, and HCl:DCS ratio is about 0.1~2.0, is used to accomplish the fabrication of selective polysilicon. A first polysilicon layer 120 is then selectively deposited over the titanium silicide layer 118 and definitely not on top of the non titanium silicide materials, such as the spacer 116. Taking a step further, the possible titanium silicide remains on the spacer are etched away by using hydrochloric acid (HCl) for ensuring no polysilicon can be deposited on the spacer.

Figure 4:
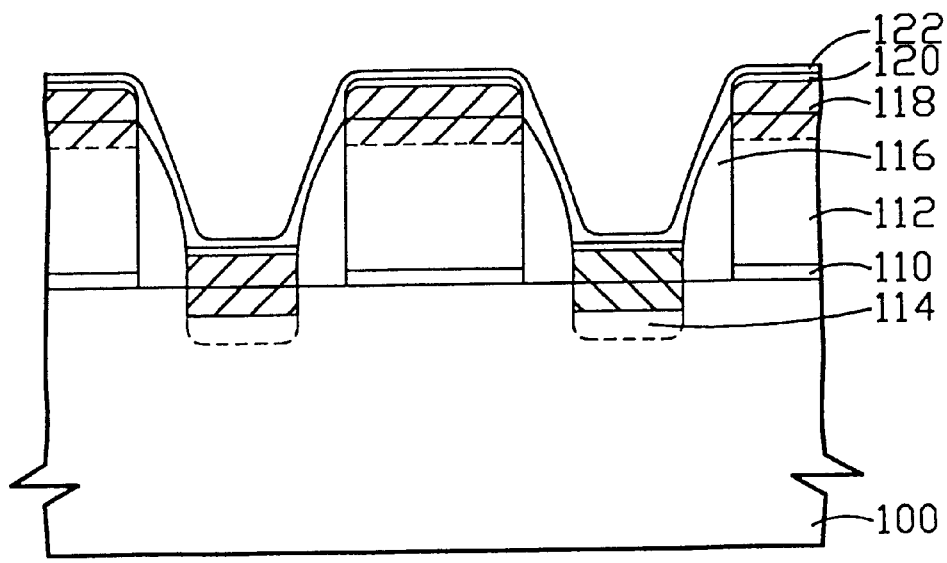
Figure 5:
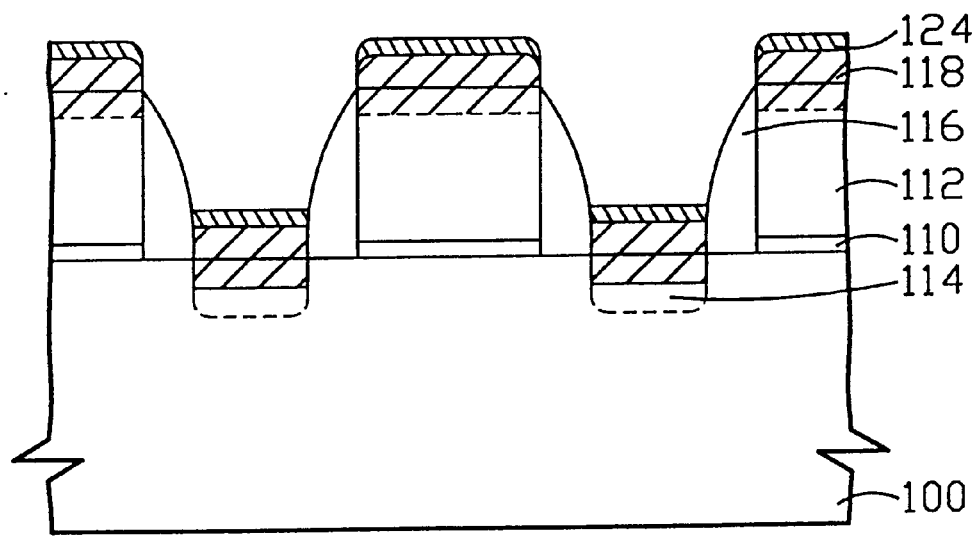

In accordance with FIG. 4, a second titanium metal layer 122 is deposited over the selectively formed polysilicon layer and overlying the exposed surface of said spacer. This particular titanium metal layer is formed by using the convention PECVD method to a thickness ranging from about 50 angstroms to about 350 angstroms. Subsequently, a rapid thermal processing is performed against the second titanium metal layer 122 and the first polysilicon layer 120 for forming a second titanium silicide layer 124, as what is shown in FIG. 5. Moreover, the unreacted titanium metal, and titanium reaction product other than titanium silicide are removed by applying the RCA cleaning method. The rapid thermal processing is carried out again at a higher temperature for transforming the higher resistance C-49 phase titanium silicide into a lower resistance C-54 phase titanium silicide.

Figure 6:
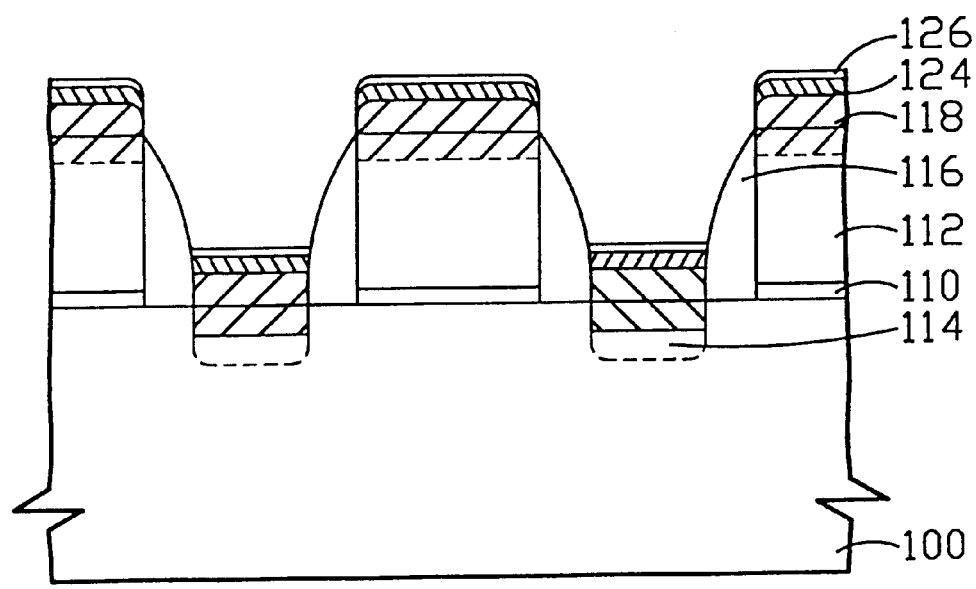
Figure 7:
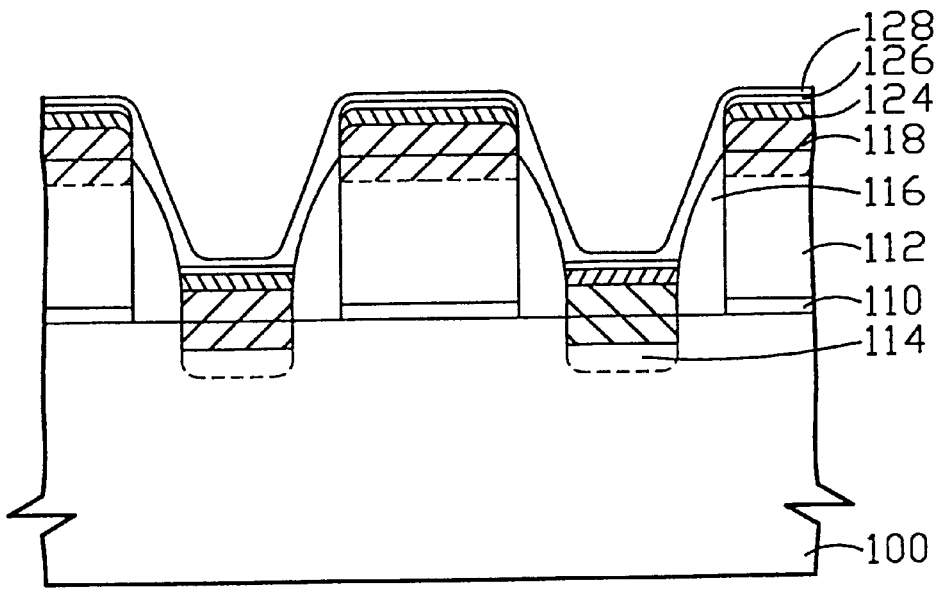
Figure 8:
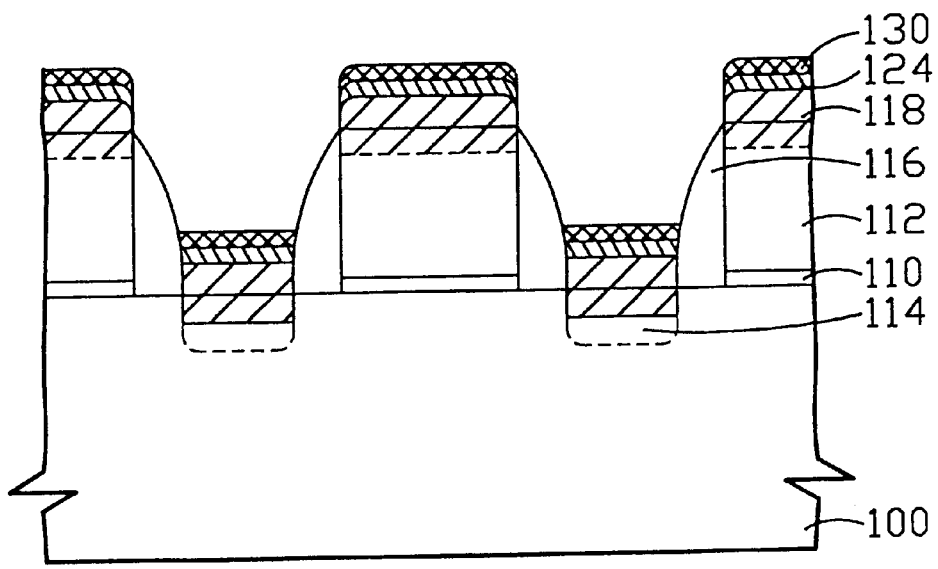

The above procedures are repeated to deposit a second polysilicon layer 126 and a third titanium metal layer 128 for forming a third titanium silicide layer 130, as referring to FIGS. 6, 7 and 8 respectively. The overall thickness of titanium silicide is depending on the requiring resistance of titanium silicide under a certain line width.

Although specific embodiments have been illustrated and described, it will be obvious to those skilled in the art that various modifications may be made without departing from what is intended to be limited solely by the appended claims.

What is claimed is:

1. A method for reducing the resistivity of silicide comprising:
    providing a semiconductor substrate, whereon is formed at least a source/drain region and a gate region, as well as a spacer formed on a sidewall of said gate region;
    depositing a first metal layer overlying said substrate;
    carrying out rapid thermal processing and wet chemical cleaning to form a first silicide layer, surface of said spacer being exposed;
    forming a silicon layer over said first silicide layer;
    depositing a second metal layer over said silicon layer and overlying the exposed surface of said spacer; and
    carrying out rapid thermal processing and wet chemical cleaning to form a second silicide layer.

2. The method in accordance with claim 1, wherein said semiconductor substrate comprises silicon.

3. The method in accordance with claim 1, wherein said gate region comprises polysilicon.

4. The method in accordance with claim 3, wherein said gate region further comprises a gate oxide layer.

5. The method in accordance with claim 1, wherein said silicon layer is selectively formed.

6. The method in accordance with claim 5, wherein said selectively formed silicon is deposited by using an epitaxial deposition system.

7. The method in accordance with claim 1 further comprising repeating the steps of silicon layer formation, metal layer deposition, rapid thermal processing, and cleaning for forming a silicide layer over said second silicide layer.

8. A method for reducing the resistivity of titanium silicide comprising:
    providing a semiconductor substrate, whereon is formed at least a source/drain region and a gate region, as well as a spacer formed on a sidewall of said gate region;
    depositing a titanium metal layer overlying said semiconductor substrate;
    carrying out rapid thermal processing and RCA cleaning to form a first titanium silicide layer, surface of said spacer being exposed;
    selectively forming a polysilicon layer over said first titanium silicide layer;
    depositing a second titanium metal layer over said selective polysilicon layer and overlying the exposed surface of said spacer; and
    carrying out rapid thermal processing and RCA cleaning to form a second titanium silicide layer.

9. The method in accordance with claim 8, wherein said semiconductor substrate comprises silicon.

10. The method in accordance with claim 8, wherein said gate region comprises polysilicon.

11. The method in accordance with claim 10, wherein said gate region further comprises a gate oxide layer.

12. The method in accordance with claim 8, wherein said titanium metal layer is deposited by using plasma enhanced chemical vapor deposition method.

13. The method in accordance with claim 12, wherein said titanium metal layer is deposited to a thickness ranging from about 50 angstroms to about 350 angstroms.

14. The method in accordance with claim 8, wherein said selectively formed polysilicon layer is only deposited on top of said first titanium silicide layer and not on said spacer.

15. The method in accordance with claim 14, wherein said selectively formed polysilicon is deposited by using an epitaxial deposition system.

16. The method in accordance with claim 8 further comprises repeating the steps of selective polysilicon layer formation, titanium metal layer deposition, rapid thermal processing, and RCA cleaning for forming a titanium silicide layer over said second titanium silicide layer.

17. The method in accordance with claim 16, wherein said rapid thermal processing used for forming silicide layer comprises a first rapid thermal processing and a second rapid thermal processing.

18. The method in accordance with claim 17, wherein said first rapid thermal processing is used to form titanium silicide layer.

19. The method in accordance with claim 17, wherein said second rapid thermal processing is used to transform high resistivity titanium silicide structure into low resistivity titanium silicide structure.

* * * * *